US009690389B2

United States Patent
Hood, III

(10) Patent No.: US 9,690,389 B2
(45) Date of Patent: Jun. 27, 2017

(54) FORCE SENSING KEYBOARD WITH AUTOMATIC ADJUSTMENT OF ACTUATION FORCE BASE ON USER TYPING STYLE

(71) Applicant: Dell Products L.P., Round Rock, TX (US)

(72) Inventor: Charles D Hood, III, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 140 days.

(21) Appl. No.: 14/031,669

(22) Filed: Sep. 19, 2013

(65) Prior Publication Data

US 2015/0077341 A1    Mar. 19, 2015

(51) Int. Cl.
   *G06F 3/02* (2006.01)
   *G06F 1/16* (2006.01)
   *H03K 17/96* (2006.01)

(52) U.S. Cl.
   CPC ............ *G06F 3/02* (2013.01); *G06F 1/1662* (2013.01); *G06F 3/0202* (2013.01); *G06F 3/0216* (2013.01); *H03K 17/9618* (2013.01); *H03K 17/9625* (2013.01); *H03K 2217/94026* (2013.01); *H03K 2217/96042* (2013.01)

(58) Field of Classification Search
   CPC ........................................................ G06F 3/02
   USPC ........................................................ 345/168
   See application file for complete search history.

(56) References Cited

U.S. PATENT DOCUMENTS

| | | | | |
|---|---|---|---|---|
| 4,795,888 A | * | 1/1989 | MacFarlane | B41J 5/26 235/145 R |
| 4,899,631 A | * | 2/1990 | Baker | G10H 1/053 84/433 |
| 5,552,763 A | * | 9/1996 | Kirby | 340/506 |
| 7,629,966 B2 | * | 12/2009 | Anson | G06F 3/0488 178/18.01 |
| 8,206,047 B1 | * | 6/2012 | Isaac et al. | 400/491 |
| 2005/0195159 A1 | * | 9/2005 | Hunleth | G06F 3/0236 345/156 |
| 2007/0011609 A1 | * | 1/2007 | Adjouadi | G06F 3/0481 715/700 |
| 2007/0219801 A1 | * | 9/2007 | Sundaram | G10L 17/04 704/270 |
| 2007/0229319 A1 | * | 10/2007 | Raisanen | H03K 17/9622 341/34 |
| 2009/0150437 A1 | * | 6/2009 | De Los Reyes | G06Q 50/18 |
| 2009/0178913 A1 | * | 7/2009 | Peterson | G06F 3/016 200/5 A |
| 2009/0210568 A1 | * | 8/2009 | Peterson | G06F 3/016 710/15 |
| 2009/0232361 A1 | * | 9/2009 | Miller | G06K 9/6293 382/115 |
| 2010/0148999 A1 | * | 6/2010 | Casparian et al. | 341/34 |

(Continued)

*Primary Examiner* — Benjamin C Lee
*Assistant Examiner* — David Lee
(74) *Attorney, Agent, or Firm* — Terrile, Cannatti, Chambers & Holland, LLP; Stephen A. Terrile

(57) ABSTRACT

A system, method, and computer-readable medium are disclosed for controlling a keyboard to provide automatic compensation for force variation in sensitivity over time for a force sensing keyboard. In certain embodiments, an information handling system includes a keyboard control system software which can automatically compensate for this variation in sensitivity over time.

10 Claims, 7 Drawing Sheets

(56) References Cited

U.S. PATENT DOCUMENTS

2011/0001613 A1* 1/2011 Ciesla .................... G06F 3/016
340/407.2
2011/0185416 A1* 7/2011 Wolfl et al. .................... 726/16

* cited by examiner

FORCE SENSING KEYBOARD WITH AUTOMATIC ADJUSTMENT OF ACTUATION FORCE BASE ON USER TYPING STYLE

BACKGROUND OF THE INVENTION

Field of the Invention

The present invention relates to the management of information handling systems. More specifically, embodiments of the invention provide a system, method, and computer-readable medium for force sensing of keystrokes on a keyboard using automatic adjustment of actuation force based on user typing style.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to provide information handling systems with an Input/Output (I/O) device such as a keyboard. One type of keyboard is a force sensing keyboard. Force sensing keyboards are an alternative to typical keyboards with key travel. Force sensing keyboards are often thinner and often lack issues relating to typical keyboards such as the potential for key caps to fall.

With force sensing keyboards, it is desired to adjust the key actuation force such that the user can touch the keys and establish hand position on the keys without actuating key strokes by accident. The key actuation force should be high enough to ignore light pressure that is applied when the user rests fingers on the home row of keys. The magnitude of this resting pressure varies from user to user. Accordingly, customization based on typing style can improve the user experience. Lighter actuation force inflicts less discomfort on the user. It is desired to adjust the actuation force to the minimum value that reliably rejects accidental key strokes from resting on the home row. Additionally, sensitivity of the force sensing resistor may vary slightly from key to key. Additionally, this variation may drift as a force sensing keyboard ages due to a number of physical wear phenomena. Accordingly, it is desirable for an information handling system to include system software which can automatically compensate for this variation in sensitivity over time.

SUMMARY OF THE INVENTION

A system, method, and computer-readable medium are disclosed for controlling a keyboard to provide automatic compensation for force variation in sensitivity over time for a force sensing keyboard. In certain embodiments, an information handling system includes a keyboard control system software which can automatically compensate for this variation in sensitivity over time.

More specifically, in certain embodiment, the automatic compensation system automatically compensates for force variation in sensitivity over time for a keyboard such as a force sensing keyboard. More specifically, in certain embodiments, the keyboard control module includes an automatic compensation system that uses at least one of a plurality of methods to detect certain defining characteristics about individual user's typing style and make appropriate adjustments. For example, in certain embodiments, the automatic compensation system uses the typing style module to detect whether the user is touch typing at all, or simply a 'hunt and peck' style typist. If resting fingers are not detected then the actuation force can be adjusted to a very low value such as 30 gram force and the feeling will be more similar to typing on a tablet's on-screen keyboard. In certain embodiments, the automatic compensation system is integrated directly into firmware of a keyboard controller.

Additionally, in certain embodiments, more subtle adjustment may be performed using operations that record and analyze a quantity of key strokes. When performing the more subtle adjustment, the auto equilibration module collects information regarding a relatively large number of keystrokes and stores this information to dynamic database of key strokes. In certain embodiments, this database is collected via a keyboard driver which is stored within the memory. In certain embodiments, the auto equilibration module attempts to compensate for variation in the Force Sensing Resistor's sensitivity from key to key, and also at the same time compensate for keys that received different amounts of force systematically based on human factors: typing style, finger weight, etc.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
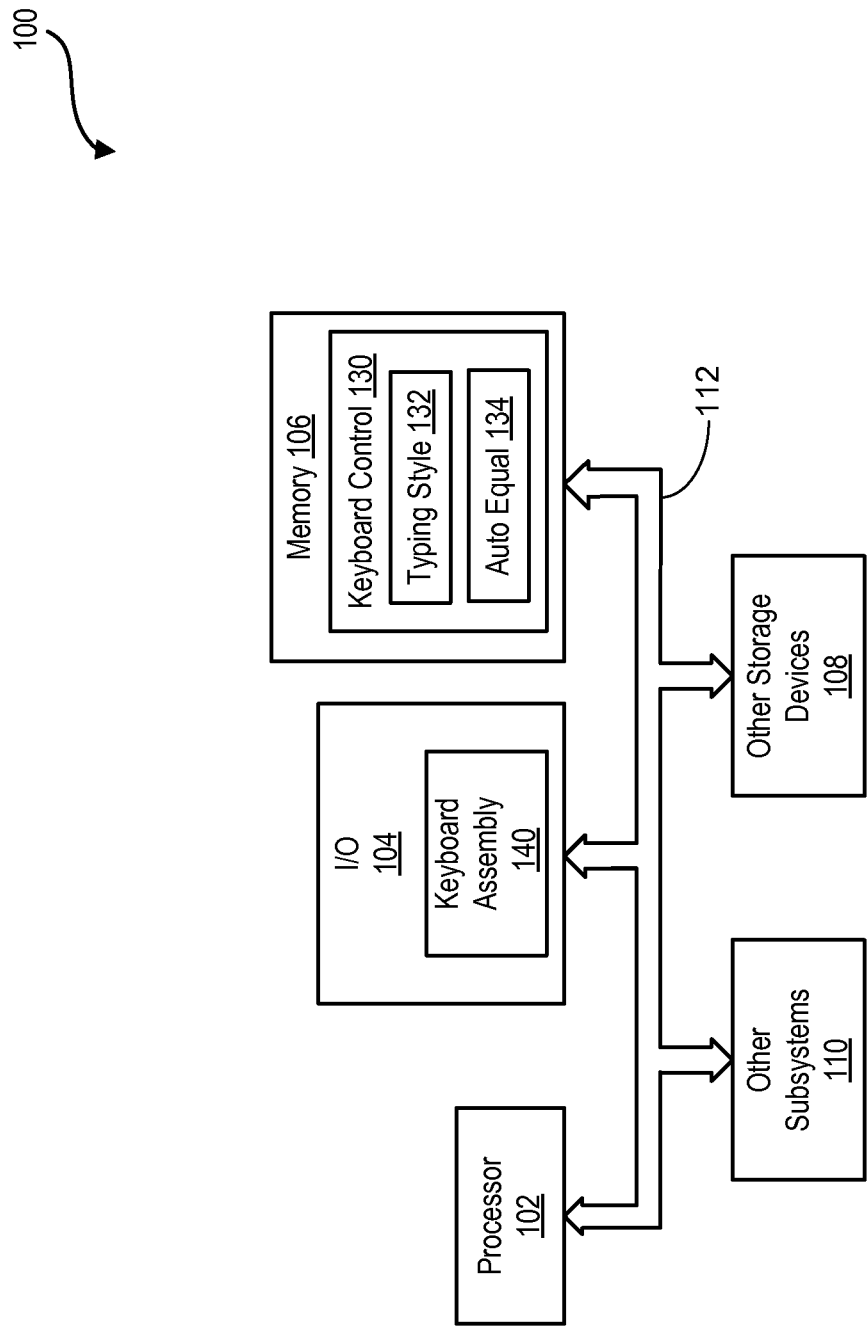
FIG. 1 shows a block diagram of an information handling system.

As will be appreciated by one skilled in the art, the present invention may be embodied as a method, system, or computer program product. Accordingly, embodiments of the invention may be implemented entirely in hardware, entirely in software (including firmware, resident software, microcode, etc.) or in an embodiment combining software and hardware. These various embodiments may all generally be referred to herein as a "circuit," "module," or "system." Furthermore, the present invention may take the form of a computer program product on a computer-usable storage medium having computer-usable program code embodied in the medium.

Any suitable computer usable or computer readable medium may be utilized. The computer-usable or computer-readable medium may be, for example, but not limited to, an electronic, magnetic, optical, electromagnetic, infrared, or semiconductor system, apparatus, or device. More specific examples (a non-exhaustive list) of the computer-readable medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, or a magnetic storage device. In the context of this document, a computer-usable or computer-readable medium may be any medium that can contain, store, communicate, or transport the program for use by or in connection with the instruction execution system, apparatus, or device.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

Embodiments of the invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Referring to FIG. 1, a block diagram of an information handling system 100 that can be used to implement the system and method of the present invention is shown. The information handling system 100 includes a processor (e.g., central processor unit or "CPU") 102, input/output (I/O) devices 104, such as a display, a keyboard, a mouse, and associated controllers, memory 106, including volatile and non-volatile memory, and various other subsystems 108. The memory includes a keyboard control module 130. In certain embodiments, the keyboard control module 130 includes a typing style module 132 and an auto equilibration module 134. Additionally, the I/O devices 104 include a keyboard assembly 140.

The keyboard control module 130 enables automatic compensation for force variation in sensitivity over time for a keyboard such as a force sensing keyboard. More specifically, in certain embodiment, the keyboard control module 130 includes an automatic compensation system that uses at least one of a plurality of methods to detect certain defining characteristics about individual user's typing style and make appropriate adjustments. For example, in certain embodiments, the automatic compensation system uses the typing style module 132 to detect whether the user is touch typing at all, or simply a 'hunt and peck' style typist. If resting fingers are not detected then the actuation force can be adjusted to a very low value such as 30 gram force and the feeling will be more similar to typing on a tablet's on-screen keyboard. In certain embodiments, the automatic compensation system is integrated directly into firmware of a keyboard controller.

Additionally, in certain embodiments, more subtle adjustment may be performed using operations that record and analyze a quantity of key strokes. When performing the more subtle adjustment, the auto equilibration module 134 collects information regarding a relatively large number of keystrokes and stores this information to dynamic database of key strokes. In certain embodiments, this database is collected via a keyboard driver which is stored within the memory 106. In certain embodiments, the auto equilibration module 134 attempts to compensate for variation in the Force Sensing Resistor's sensitivity from key to key, and also at the same time compensate for keys that received different amounts of force systematically based on human factors: typing style, finger weight, etc.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 2:
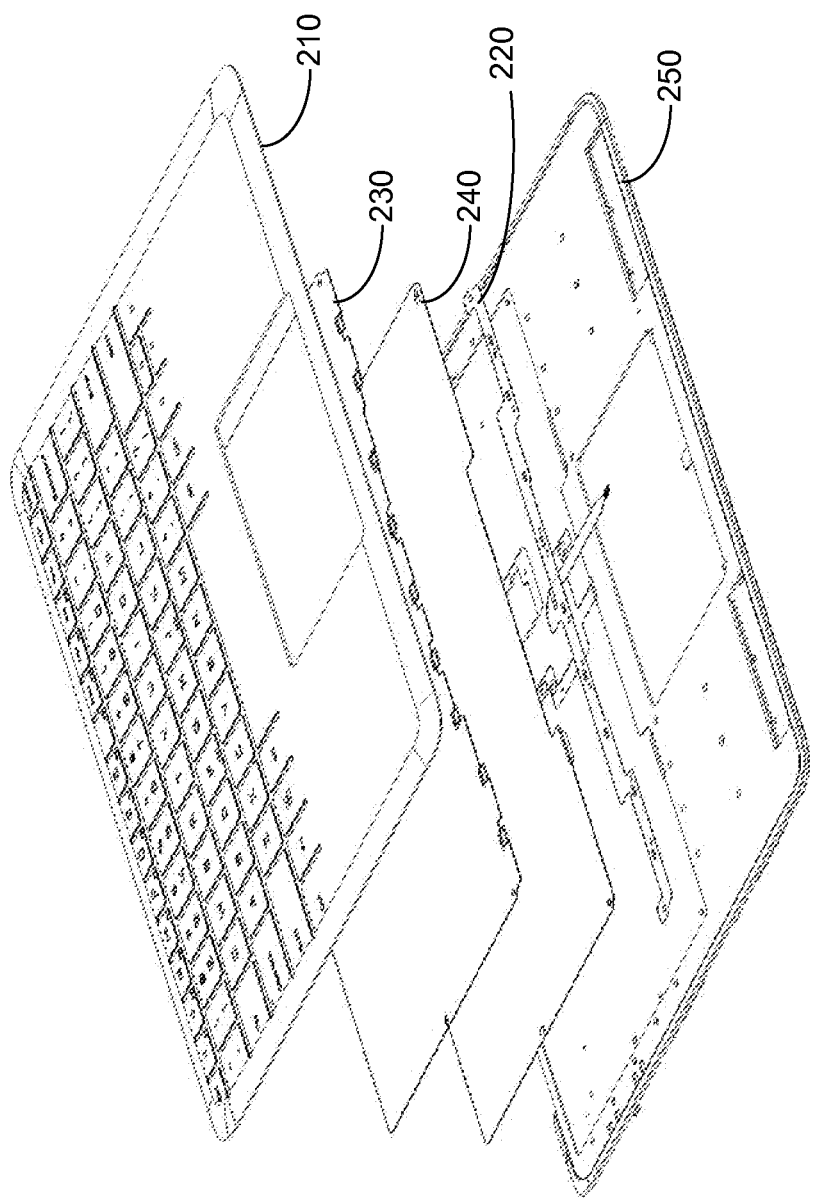
FIG. 2 shows a perspective exploded view of a keyboard system.

FIG. 2 shows a perspective exploded view of a keyboard system. More specifically, the keyboard system 200 includes a keymat 210 (also referred to as a keypad), such as a silicone keymat, a light emitting diode (LED) flex portion 220 for providing back lighting to the keymat, a light guide 230, such as a light guide sheet, for dispersing the light generated by the LED flex portion 220, a force sensing portion 240, such as a force sensing membrane, and a keyboard system support 250, such as a metal support plate.

Figure 3:
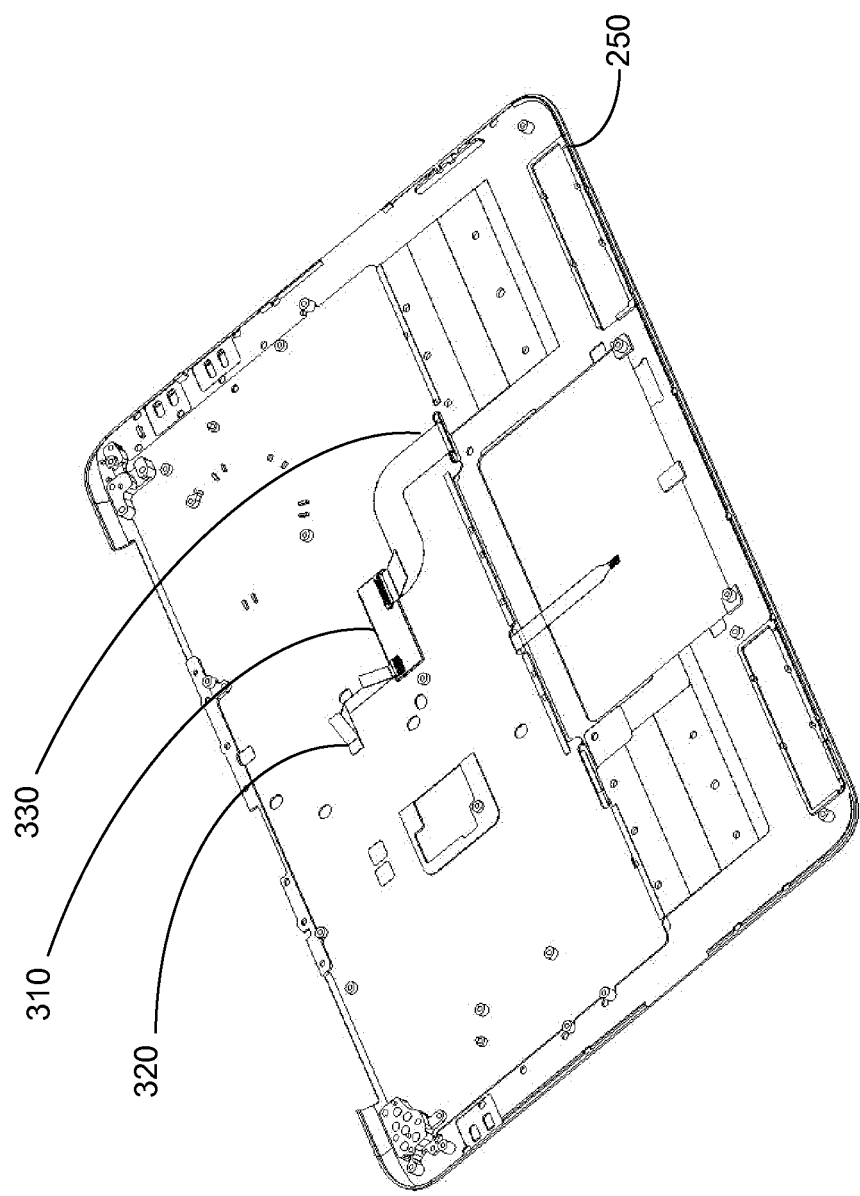
FIG. 3 shows a perspective view of a support plate of a keyboard system.

FIG. 3 shows a perspective view of a support 250 of the keyboard system 200. More specifically, the keyboard system 200 further includes a keyboard control circuit 310 as well as a system connector 320 and a force sensing connector 330. The system connector 320 couples the keyboard control circuit 310 to a system board of the information handling system via, e.g., a serial interface such as a I2C interface. The force sensing connector 330 couples the keyboard control circuit 310 to the force sensing portion 240. The keyboard control circuit 310 includes a keyboard processor such as a keyboard micro controller as well as an analog to digital conversion circuit. In certain embodiments, the keyboard control circuit 310 may further include a memory which stores the keyboard control module 130 for execution by the keyboard processor.

Figure 4A:
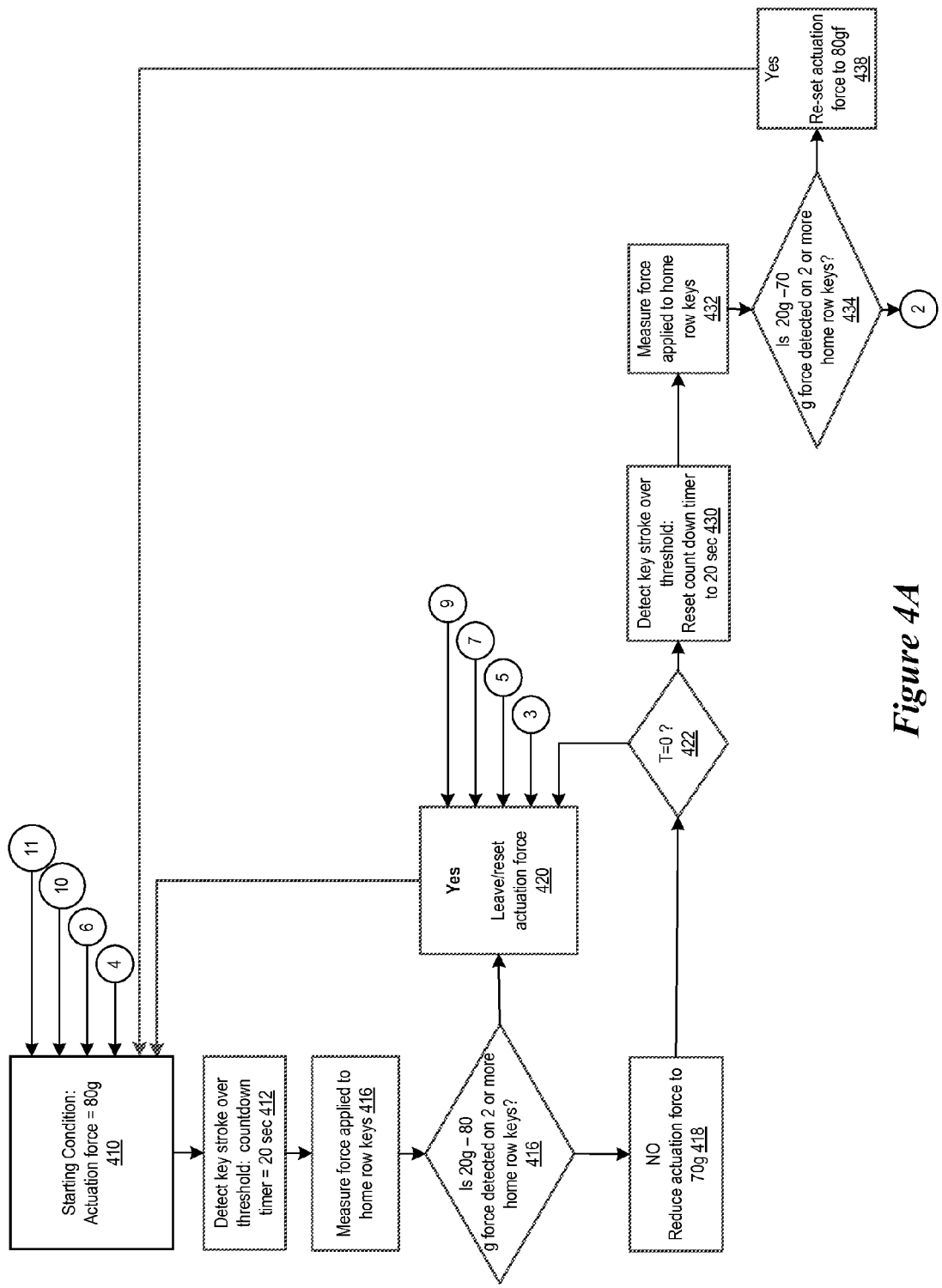
FIGS. 4A-4C, generally referred to as FIG. 4, show a flow chart of the operation of a typing style module.
Figure 4B:
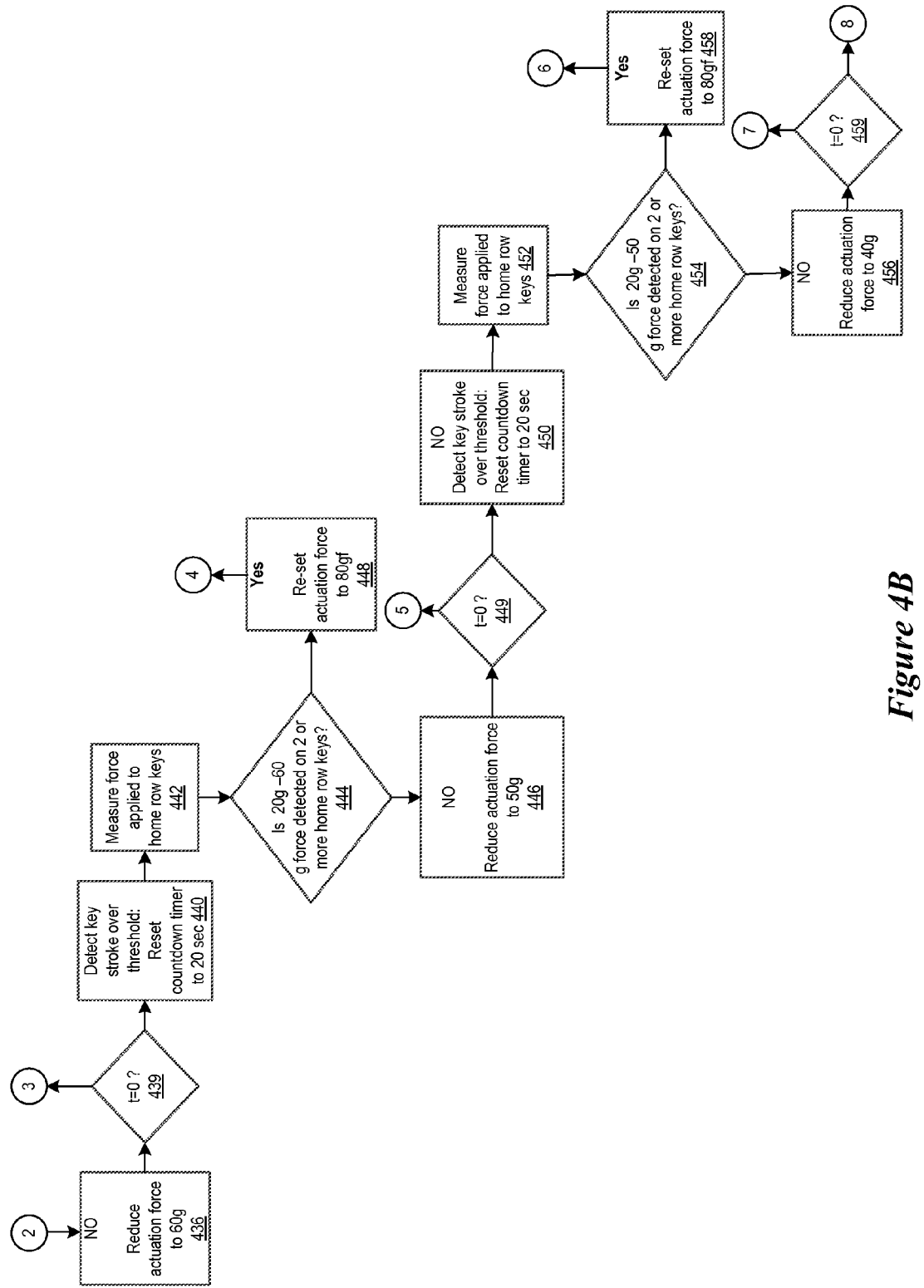
Figure 4C:
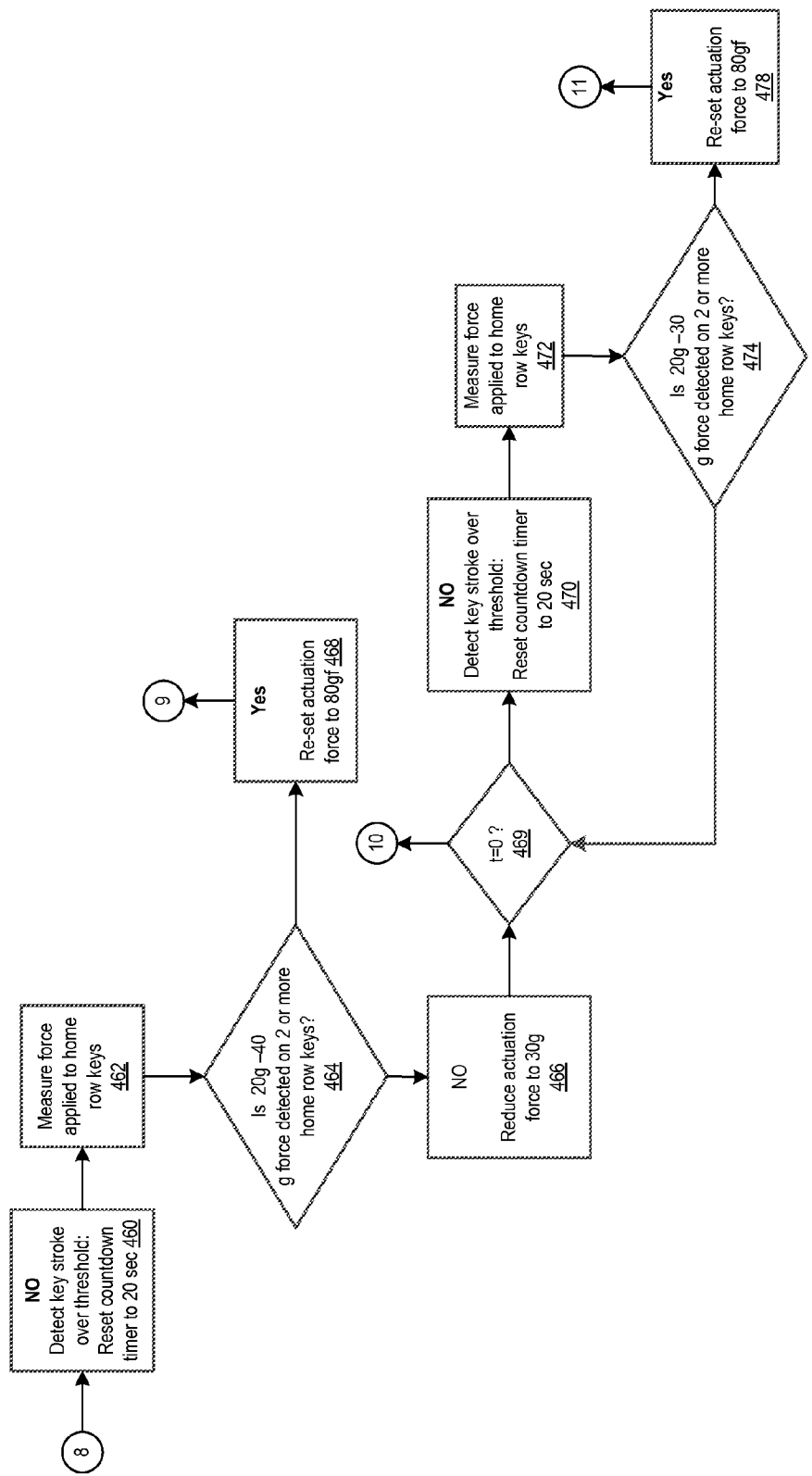

FIGS. 4A-4C, generally referred to as FIG. 4, show a flow chart of the operation of a typing style module 132. More specifically, operation of the typing style module 132 starts at step 410 with a starting condition by setting the keyboard actuation force to a predetermined level (e.g., to 80 grams). Next at step 412, the typing style module 132 detects a keystroke over a certain threshold. In various embodiments, the certain threshold corresponds to the predetermined level (e.g., to 80 grams). When a keystroke has a force over the threshold, then a countdown timer is started with a predetermined time (e.g., 20 seconds). The predetermined time relates to a value for a reasonable maximum time between keystrokes to define activity or inactivity. Next at step 414 the typing style module 132 measures a force that is applied to particular keys of the keypad (e.g., keys within a home row of the keypad). The home row of keys (i.e., the home keys) refers to certain keys of the center row of alphabetical letters on the keyboard. On the most common type of English language keyboard, the QWERTY layout, the keys A S D F J K L represent the contents of the home row.

Next, at step 416, the typing style module 132 determines whether a predetermined force range is detected on a predetermined number of keys. In certain embodiments the predetermined force range corresponds to a range of 20 grams to 80 grams. Additionally, in certain embodiments the predetermined number of keys is a plurality of keys. Additionally, in certain embodiments, the plurality of keys comprises 2 keys. Additionally, in certain embodiments, the keys are located within the home row of the keypad. If the detected force is not within the predetermined force range or is not detected on the predetermined number of keys, then the actuation force is set to a lower predetermined level (e.g., to 70 grams) at step 418. If the detected force is within the predetermined force range and is detected on the predetermined number of keys, then the actuation force is left at the predetermined level (e.g., 80 grams) at step 420 and the typing style module returns to the starting condition 410. The predetermined level of actuation force is set to be a high enough force to reject un-intended key strokes if a touch typist touches the home row to find position. Next, at step 422, the typing style module 132 determines whether the countdown timer has reached zero. If yes, then at step 420, the actuation force is reset to the predetermined level (e.g., 80 grams).

If not, then at step 430, the typing style module 132 detects a keystroke over a certain lower threshold (e.g., 70 grams). When a keystroke has a force over the threshold, then the countdown timer is reset with a predetermined time (e.g., 20 seconds). Next at step 432 the typing style module 132 measures a force that is applied to particular keys of the keypad (e.g., keys within a home row of the keypad). Next, at step 434, the typing style module 132 determines whether a predetermined force range is detected on a predetermined number of keys. In certain embodiments the predetermined force range corresponds to a range of 20 grams to 70 grams. Additionally, in certain embodiments the predetermined number of keys is a plurality of keys. Additionally, in certain embodiments, the plurality of keys comprises 2 keys. Additionally, in certain embodiments, the keys are located within the home row of the keypad. If the detected force is not within the predetermined force range or is not detected on the predetermined number of keys, then the actuation force is set to another lower predetermined level (e.g., to 60 grams) at step 436. If the detected force is within the predetermined force range and is detected on the predetermined number of keys, then the actuation force is reset to the predetermined level (e.g., 80 grams) at step 438 and the typing style module returns to the starting condition 410. Next, at step 439, the typing style module 132 determines whether the countdown timer has reached zero. If so, then at step 420, the actuation force is reset to the predetermined level (e.g., 80 grams).

If not, then at step 440, the typing style module 132 detects a keystroke over a certain threshold (e.g., 60 grams). When a keystroke has a force over the threshold, then the countdown timer is reset with a predetermined time (e.g., 20 seconds). Next at step 442 the typing style module 132 measures a force that is applied to particular keys of the keypad (e.g., keys within a home row of the keypad). Next, at step 444, the typing style module 132 determines whether a predetermined force range is detected on a predetermined number of keys. In certain embodiments the predetermined force range corresponds to a range of 20 grams to 60 grams. Additionally, in certain embodiments the predetermined number of keys is a plurality of keys. Additionally, in certain embodiments, the plurality of keys comprises 2 keys. Additionally, in certain embodiments, the keys are located within the home row of the keypad. If the detected force is not within the predetermined force range or is not detected on the predetermined number of keys, then the actuation force is set to another lower predetermined level (e.g., to 50 grams) at step 446. If the detected force is within the predetermined force range and is detected on the predetermined number of keys, then the actuation force is reset to the predetermined level (e.g., 80 grams) at step 448 and the typing style module returns to the starting condition 410. Next, at step 449, the typing style module 132 determines whether the countdown timer has reached zero. If so, then at step 420, the actuation force is reset to the predetermined level (e.g., 80 grams).

If not, then at step 450, the typing style module 132 detects a keystroke over a certain threshold (e.g., 50 grams). When a keystroke has a force over the threshold, then the countdown timer is reset with a predetermined time (e.g., 20 seconds). Next at step 452 the typing style module 132 measures a force that is applied to particular keys of the keypad (e.g., keys within a home row of the keypad). Next, at step 454, the typing style module 132 determines whether a predetermined force range is detected on a predetermined number of keys. In certain embodiments the predetermined force range corresponds to a range of 20 grams to 50 grams. Additionally, in certain embodiments the predetermined number of keys is a plurality of keys. Additionally, in certain embodiments, the plurality of keys comprises 2 keys. Additionally, in certain embodiments, the keys are located within the home row of the keypad. If the detected force is not within the predetermined force range or is not detected on the predetermined number of keys, then the actuation force is set to another lower predetermined level (e.g., to 40 grams) at step 456. If the detected force is within the predetermined force range and is detected on the predetermined number of keys, then the actuation force is reset to the predetermined level (e.g., 80 grams) at step 458 and the typing style module returns to the starting condition 410. Next, at step 459, the typing style module 132 determines whether the countdown timer has reached zero. If so, then at step 420, the actuation force is reset to the predetermined level (e.g., 80 grams).

If not, then at step 460, the typing style module 132 detects a keystroke over a certain threshold (e.g., 40 grams). When a keystroke has a force over the threshold, then the countdown timer is reset with a predetermined time (e.g., 20 seconds). Next at step 462 the typing style module 132 measures a force that is applied to particular keys of the keypad (e.g., keys within a home row of the keypad). Next, at step 464, the typing style module 132 determines whether a predetermined force range is detected on a predetermined number of keys. In certain embodiments the predetermined force range corresponds to a range of 20 grams to 40 grams. Additionally, in certain embodiments the predetermined number of keys is a plurality of keys. Additionally, in certain embodiments, the plurality of keys comprises 2 keys. Additionally, in certain embodiments, the keys are located within the home row of the keypad. If the detected force is not within the predetermined force range or is not detected on the predetermined number of keys, then the actuation force is set to another lower predetermined level (e.g., to 30 grams) at step 466. If the detected force is within the predetermined force range and is detected on the predetermined number of keys, then the actuation force is reset to the predetermined level (e.g., 80 grams) at step 468 and the typing style module returns to the starting condition 410. Next, at step 469, the typing style module 132 determines whether the countdown timer has reached zero. If so, then at step 420, the actuation force is reset to the predetermined level (e.g., 80 grams).

If not, then at step 470, the typing style module 132 detects a keystroke over a certain threshold (e.g., 30 grams). When a keystroke has a force over the threshold, then the countdown timer is reset with a predetermined time (e.g., 20 seconds). Next at step 472 the typing style module 132 measures a force that is applied to particular keys of the keypad (e.g., keys within a home row of the keypad). Next, at step 474, the typing style module 132 determines whether a predetermined force range is detected on a predetermined number of keys. In certain embodiments the predetermined force range corresponds to a range of 20 grams to 30 grams. Additionally, in certain embodiments the predetermined number of keys is a plurality of keys. Additionally, in certain embodiments, the plurality of keys comprises 2 keys. Additionally, in certain embodiments, the keys are located within the home row of the keypad. If the detected force is not within the predetermined force range or is not detected on the predetermined number of keys, the typing style module 132 determines whether the countdown timer has reached zero at step 469. If not, then at step 470, the typing style module 132 detects a keystroke over a certain threshold (e.g., 30 grams) and resets the countdown timer with a predetermined time (e.g., 20 seconds). If the detected force is within the predetermined force range and is detected on the predetermined number of keys, then the actuation force is reset to the predetermined level (e.g., 80 grams) at step 478 and the typing style module returns to the starting condition 410.

Figure 5:
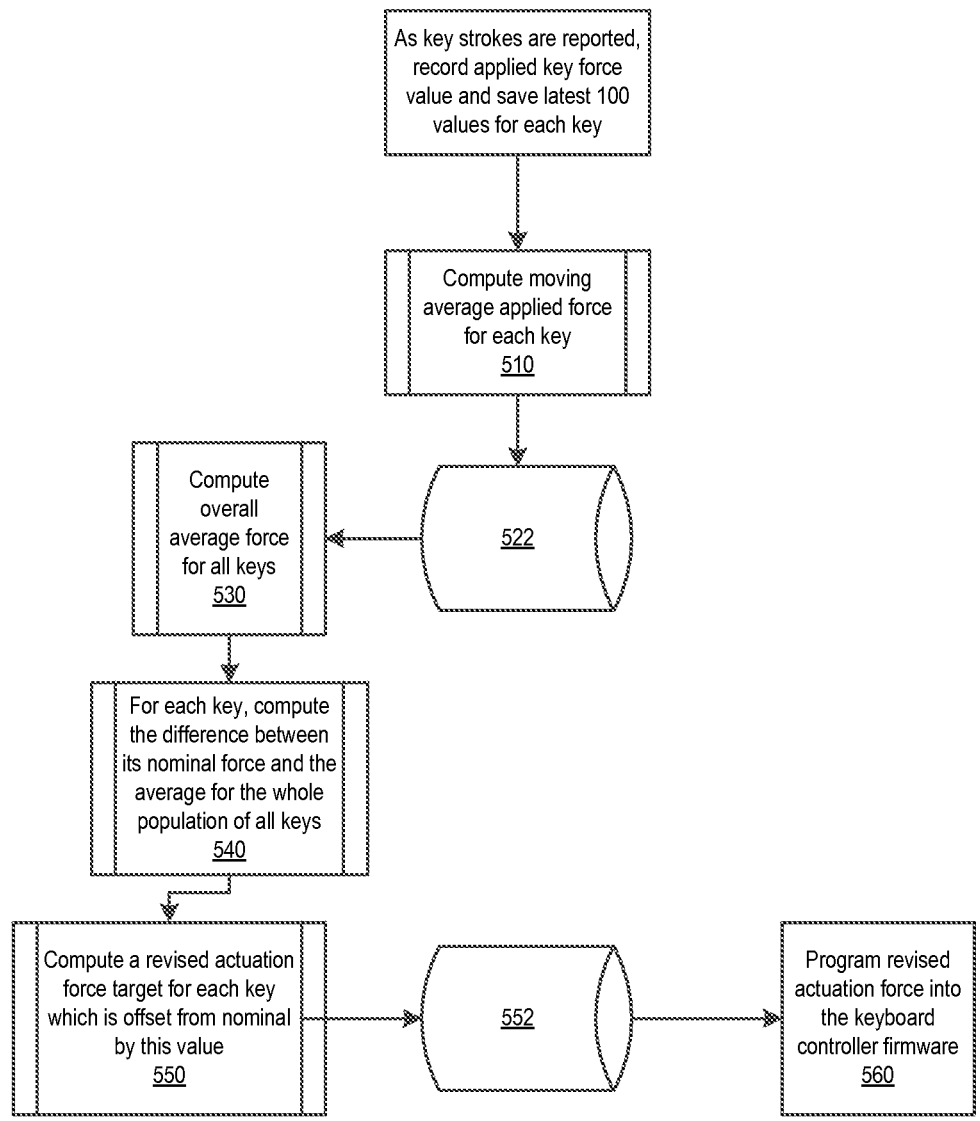
FIG. 5 shows a flow chart of the operation of an auto equilibration.

FIG. 5 shows a flow chart of the operation of an auto equilibration module 134. More specifically, the auto equilibration module 134 begins operation at step 510 by recording applied key force values for a predetermined number of key strokes as key strokes are reported. In certain embodiments, the predetermined number of keystrokes corresponds to the last 100 key strokes. Next at step 520, the auto equilibration module 134 computes a moving average of applied force for each key of the keypad and saves this moving average at step 522. Next, at step 530, the auto equilibration module 134 computes an overall average force for all keys of the keypad. Next, at step 540, for each key on the keypad, the auto equilibration module 134 computes a difference between a nominal force and an average force for the entire population of keys on the key pad. Next, at step 550, the auto equilibration module 134 computes a revised actuation force target value for each key which is offset from nominal by the value that is computed for each key at step 540. These revised actuation force target values are stored at step 552. Next, at step 560, the auto equilibration module 134 provides the revised actuation force target values to the keyboard control circuit 310. In certain embodiments, the revised actuation force target values are stored within memory of the keyboard control circuit 310. Additionally, in certain embodiments, the memory to which the revised actuation force target values are stored includes firmware.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:
1. A computer-implementable method for controlling a force sensing keyboard to provide automatic compensation for force variation in sensitivity, comprising:
 detecting defining characteristics regarding a typing style of an individual user; and,
 automatically compensating for force variation in sensitivity over time based upon the defining characteristics regarding the typing style of the individual user to provide automatic compensation for force variation in sensitivity of the keyboard; and
 wherein
 the detecting the defining characteristics comprises detecting variations in the defining characteristics over time;
 the automatically compensating accounts for the variations in the defining characteristics over time the detecting the defining characteristics comprises determining a typing style of the individual user between a touch type style and a hunt and peck style;
if the typing style corresponds to the touch type style then applying or making use of a force sensing keyboard sensitivity for the keyboard; and,
if the typing style corresponds to the hunt and peck style then adjusting the sensitivity of the keyboard to correspond to be similar to typing on touch screen type keyboard which is different from the force sensing keyboard sensitivity.

2. The method of claim 1, wherein:
the detecting the defining characteristics additionally comprises recording and analyzing a quantity of key strokes.

3. The method of claim 2, wherein:
the recording and analyzing the quantity of key strokes is further used in compensating for variation in force on a key by key basis so as to compensate for keys that receive different amounts of force systematically based on human factors.

4. A system comprising:
a processor;
a data bus coupled to the processor; and
a non-transitory, computer-readable storage medium embodying computer program code, the non-transitory, computer-readable storage medium being coupled to the databus, the computer program code interacting with a plurality of computer operations and comprising instructions executable by the processor and configured for:
detecting defining characteristics regarding a typing style of an individual user on a force sensing keyboard; and,
automatically compensating for force variation in sensitivity over time based upon the defining characteristics regarding the typing style of the individual user to provide automatic compensation for force variation in sensitivity of the keyboard; and
wherein
the detecting the defining characteristics comprises detecting variations in the defining characteristics over time;
the automatically compensating accounts for the variations in the defining characteristics over time;
the detecting the defining characteristics comprises determining the typing style of the individual user between a touch type style and a hunt and peck style;
if the typing style corresponds to the touch type style then applying or making use of a force sensing keyboard sensitivity for the keyboard; and,
if the typing style corresponds to a hunt and peck style then adjusting the sensitivity of the keyboard to correspond to be similar to typing on touch screen type keyboard which is different from the force sensing keyboard sensitivity.

5. The system of claim 4, wherein:
the detecting the defining characteristics additionally comprises recording and analyzing a quantity of key strokes.

6. The system of claim 5, wherein:
the recording and analyzing the quantity of key strokes is further used in compensating for variation in force on a key by key basis so as to compensate for keys that receive different amounts of force systematically based on human factors.

7. A non-transitory, computer-readable storage medium embodying computer program code, the computer program code comprising computer executable instructions configured for:
detecting defining characteristics regarding a typing style of an individual user on a force sensing keyboard; and,
automatically compensating for force variation in sensitivity over time based upon the defining characteristics regarding the typing style of the individual user to provide automatic compensation for force variation in sensitivity of the keyboard and
wherein
the detecting the defining characteristics comprises detecting variations in the defining characteristics over time;
the automatically compensating accounts for the variations in the defining characteristics over time
the detecting the defining characteristics comprises determining the typing style of the individual user between a touch type style and a hunt and peck style;
if the typing style corresponds to the touch type style then applying or making use of a force sensing keyboard sensitivity for the keyboard; and,
if the typing style corresponds to a hunt and peck style then adjusting the sensitivity of the keyboard assembly to correspond to be similar to typing on touch screen type keyboard which is different from the force sensing keyboard sensitivity.

8. The non-transitory, computer-readable storage medium of claim 7, wherein:
the detecting the defining characteristics additionally comprises recording and analyzing a quantity of key strokes.

9. The non-transitory, computer-readable storage medium of claim 8, wherein:
the recording and analyzing the quantity of key strokes is further used in compensating for variation in force on a key by key basis so as to compensate for keys that receive different amounts of force systematically based on human factors.

10. A computer-implementable method for controlling a keyboard to provide automatic compensation for force variation in sensitivity, comprising:
detecting defining characteristics regarding a typing style of an individual user; and,
automatically compensating for force variation in sensitivity over time based upon the defining characteristics regarding the typing style of the individual user to provide automatic compensation for force variation in sensitivity of the keyboard; and
wherein
the keyboard comprises a force sensing keyboard;
the detecting the defining characteristics comprises detecting variations in the defining characteristics over time;
the automatically compensating accounts for the variations in the defining characteristics over time;
the detecting the defining characteristics comprises determining the typing style of the individual user between a touch type style and a hunt and peck style, and recording and analyzing a quantity of key strokes;
if the typing style corresponds to the touch type style then applying or making use of a force sensing keyboard sensitivity for the keyboard; and,
if the typing style corresponds to the hunt and peck style then adjusting the sensitivity of the keyboard assembly to correspond to be similar to typing on touch screen type keyboard which is different from the force sensing keyboard sensitivity;

the recording and analyzing the quantity of key strokes is further used in automatically compensating for variation in force on a key by key basis so as to compensate for keys that receive different amounts of force systematically based on human factors.

\* \* \* \* \*